(12) United States Patent
Dzienis et al.

(10) Patent No.: US 11,467,200 B2
(45) Date of Patent: Oct. 11, 2022

(54) METHOD AND DEVICE FOR IDENTIFYING THE LOCATION OF A FAULT IN AN ELECTRICAL POWER DISTRIBUTION NETWORK

(71) Applicant: Siemens Aktiengesellschaft, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/471,432

(22) Filed: Sep. 10, 2021

(65) Prior Publication Data

US 2022/0074984 A1 Mar. 10, 2022

(30) Foreign Application Priority Data

Sep. 10, 2020 (EP) .................................. 20195488

(51) Int. Cl.
*G01R 31/08* (2020.01)

(52) U.S. Cl.
CPC .................................. *G01R 31/086* (2013.01)

(58) Field of Classification Search
CPC ........................... G01R 31/086; G01R 31/085; G01R 19/2506; G01R 19/28
USPC ........................................................ 324/522
See application file for complete search history.

(56) References Cited

U.S. PATENT DOCUMENTS

| 4,996,624 A | 2/1991 | Schweitzer, III |
| 5,929,642 A | 7/1999 | Philippot et al. |
| 8,655,609 B2 | 2/2014 | Schweitzer, II et al. |
| 9,279,846 B2 * | 3/2016 | Schuster ................ H02H 7/266 |
| 2020/0110124 A1 | 4/2020 | Schweitzer, III et al. |

FOREIGN PATENT DOCUMENTS

WO    WO 2019232595 A1    12/2019

OTHER PUBLICATIONS

Guzman, Armando et al: "Accurate and economical traveling-wave fault locating without communications"; 2018 71 St Annual Conference for Protective Relay Engineers (CPRE); IEEE; 26. Mar. 2018; pp. 1-18; XP033335997; DOI:10.1109/CPRE.2018.8349768.

(Continued)

*Primary Examiner* — Farhana A Hoque
(74) *Attorney, Agent, or Firm* — Laurence A. Greenberg; Werner H. Stemer; Ralph E. Locher (57) ABSTRACT

Method and device for determining a fault location in an electric power distribution network with an infeed and lines in the form of a main strand and a multiplicity of branches of the main strand. First and second measured values are acquired at a first and second measurement point of the power distribution network, and a fault location is determined based on the first and the second measured values. Arrival of respective traveling waves are identified based on the first and the second measured values, and the times of the respective arrival of the traveling wave are stored. A first fault location value is generated using the respective times of both measurement points and a second fault location value is generated using the times of only the first measurement point. The fault location is determined based on the first fault location value and the second fault location value.

14 Claims, 8 Drawing Sheets

(56) References Cited

OTHER PUBLICATIONS

Fluty Wesley et al: "Electric Transmission Fault Location Techniques Using Traveling Wave Method and Discrete Wavelet Transform", 2020 Clemson University Power Systems Conference (PSC), IEEE, Mar. 10, 2020 (Mar. 10, 2020), pp. 1-8, XP033787605, DOI: 10.1109/PSC50246.2020.9131271.

* cited by examiner

METHOD AND DEVICE FOR IDENTIFYING THE LOCATION OF A FAULT IN AN ELECTRICAL POWER DISTRIBUTION NETWORK

CROSS-REFERENCE TO RELATED APPLICATION

This application claims the priority, under 35 U.S.C. § 119, of European patent application EP 20195488.0, filed Sep. 10, 2020; the prior application is herewith incorporated by reference in its entirety.

FIELD AND BACKGROUND OF THE INVENTION

The invention relates to a method for determining a fault location in an electric power distribution network, wherein the power distribution network comprises at least one infeed as well as lines in the form of a main strand and a multiplicity of branches branching off from the main strand, and wherein, in the method, first measured values are acquired at a first measurement point of the power distribution network, second measured values are acquired at a second measurement point of the power distribution network, and the fault location of the fault that has occurred in the power distribution network is determined on the basis of the first and the second measured values.

The invention also relates to a device for performing such a method.

The reliable operation of electric power supply networks requires fast and reliable identification and shutdown of any faults, such as for example short circuits or earth faults. Causes of faults that bring about a shutdown may be for example lightning strikes, torn or otherwise damaged lines, faulty insulation in cable lines or unwanted contact between overhead lines and parts of animals or plants. In order to shorten fault-induced downtimes, such faults have to be located as accurately as possible in order to allow a maintenance team to rectify the cause of the fault, along with any resulting damage caused by the fault.

The fault location at which the fault is located on a line may be demarcated through analysis of measured variables, for example currents and voltages, acquired during the occurrence of the fault. To this end, in the meantime, multiple different methods are known, the accuracy of which has a significant effect on the maintenance expenditure of the power supply network. Great value is therefore placed on improving the accuracy of the algorithms used for fault location, in order to facilitate maintenance and in particular to shorten fault-induced downtimes of the power supply network.

Methods for more accurate fault location use for example the measured current or voltage signals of the fundamental (50 Hz or 60 Hz signals) for fault location purposes. In this case, in particular for power transmission lines, methods are known that use measured values from only one of the ends of the line (single-sided fault location) or measured values from both ends of the line (two-sided fault location). As a result, the fault location is generally given as the distance from the respective measurement point (in terms of percentage of the line or in km or miles). When using measured values from only one end of the line, the outlay for performing fault location is low. This fault location method is predominantly an impedance-based method in which an impedance to the fault location is calculated from current and voltage measured values. It is possible to draw a conclusion with regard to the fault location through comparison with the line impedance of the whole line in the fault-free case. One exemplary embodiment of such a fault location method may be found for example in US patent document U.S. Pat. No. 4,996,624 A.

It is possible to achieve improved accuracy in fault location on transmission lines by using measured values from both ends of the line. In this case, the fault location-related measured values have to be combined via a suitable communication connection. In this connection, reference is made to US patent document U.S. Pat. No. 5,929,642; in the method described there, a relatively high fault location accuracy (measurement error of approximately 1-2%) is achieved using current and voltage measured values from both ends of the line with the aid of estimation methods and non-linear optimization methods.

Said fault location methods are particularly suited to linear network topologies without branches, that is to say for lines having two line ends. For power distribution networks, in which a multiplicity of branches usually branch off from a main strand and from which end consumers and small generators are connected to the power supply network, such fault location methods are of only limited suitability.

In the case of such networks, which are branched in any case, rapid integration of renewable power sources and the dismantling of existing power networks however in many situations require the construction of even more greatly branched network topologies.

By way of example, staggered switch topologies are nowadays used for fault location in power distribution networks (cf. for example U.S. Pat. No. 9,279,846 B2). In this case, a fault in the power distribution network is shut down by way of a power switch arranged at the infeed on the main strand, and the line is then divided into line sections by opening multiple section switches. After the power supply has been turned back on by the power switch, the line is reactivated in sections until the fault occurs again. The fault is identified on the last line section that is activated. It is usually not possible to determine the fault location more accurately, in particular including to distinguish between faults on the main strand and the branches, or this is able to be achieved only using additional technology.

Using previous technology, the faulty line could also be established through the additional use of transient earth fault relays. To this end, however, a device having a transient earth fault function would have to be installed on each branch, this entailing considerable costs. Fault location systems using the transient earth fault principle are therefore used only when rapid identification of the faulty line is absolutely necessary for the reliability of the supply.

SUMMARY OF THE INVENTION

The invention is based on the object of specifying a possibility for fault location in an electric power distribution network that is able to be performed with as few measuring devices as possible.

This object is achieved by a method for determining a fault location in an electric power distribution network, wherein the power distribution network has at least one infeed as well as lines in the form of a main strand and a multiplicity of branches branching off from the main strand, the method of:

acquiring first measured values at a first measurement point of the power distribution network;
acquiring second measured values at a second measurement point of the power distribution network;

determining the fault location of the fault that has occurred in the power distribution network based on the first and the second measured values;

identifying the arrival of respective traveling waves based on the first and the second measured values, these traveling waves indicating a fault that has occurred in the power distribution network, and storing the times of the respective arrival of the traveling waves;

performing a first fault-locating process using the respective times of both measurement points for generating a first fault location value;

performing a second fault-locating process using the times of only the first measurement point for generating a second fault location value; and determining the fault location based on the first fault location value and the second fault location value.

This object is similarly achieved by a method of the type specified at the outset, in which the arrival of respective traveling waves is identified on the basis of the first and the second measured values, these traveling waves indicating a fault that has occurred in the power distribution network, and the times of the respective arrival of the traveling wave are stored, a first fault location is performed using the respective times of both measurement points, generating a first fault location value in the process, a second fault location is performed using the times of only the first measurement point, generating a second fault location value in the process, and the fault location is determined based on the first fault location value and the second fault location value.

The specific advantage of the method according to the invention is that it uses the possibilities of fault location in accordance with the traveling wave principle and in the process combines two-sided fault location with single-sided fault location.

Specifically, while the accuracy of fault location in impedance-based fault location methods is dependent on the measurement accuracy of the transducers that are used and on the state of the network, using a fault location method in accordance with the traveling wave principle ("Traveling Wave Fault Location"), as it is known, makes it possible to achieve a large degree of independence from these variables. According to this principle, instead of the fundamentals of the measured current and voltage signals, the high-frequency signal components occurring during the fault, which take the form of what are known as "traveling waves", are taken into consideration for fault location. In this case, the high-frequency traveling wave edges are acquired through measurement and provided with a timestamp. Since the propagation speed of the traveling waves is roughly the speed of light, it is possible to achieve good location of the fault from the evaluation of the timestamp. It is possible to achieve accuracies in the range of a few dozen meters using this fault location method. One example of such a fault location method may be found in US patent document U.S. Pat. No. 8,655,609 B2.

In addition to high accuracy, the speed of the fault location in accordance with the traveling wave principle also constitutes a significant advantage of the method according to the invention. By combining two-sided fault location with just single-sided fault location, it is possible to determine the fault location with great accuracy using just two devices.

One advantageous embodiment of the method according to the invention makes provision for the acquired measured values to be broken down into modal components, wherein at least two of the components have different propagation speeds along the lines of the power distribution network, and at least partially different modal components are applied for the first and the second fault location.

It is thereby advantageously possible to use different propagation speeds of the various modes for more accurate fault location.

Specifically, provision may be made in this connection for respective times to be used for the first fault location for forming the first fault location value, at which times the in each case first wave edge of a modal zero component of the respective traveling wave arrived at the first and the second measurement point.

In the case of a modal breakdown into $\alpha$, $\beta$ and zero components, the zero component, which is able to be acquired easily through measurement, is particularly well-suited for the purposes of two-sided fault location.

As an alternative or in addition, provision may be made in this connection for respective times to be used for the second fault location for forming the second fault location value, at which times the in each case first wave edge of a modal zero component and of a modal $\alpha$ or $\beta$ component of the traveling wave arrived at the first measurement point.

Since the zero component, on the one hand, and the $\alpha$ and $\beta$ component, on the other hand, have significantly different propagation speeds from one another, they are well-suited for the purposes of single-sided fault location.

According to one advantageous embodiment of the method according to the invention, there may additionally be provision, in the event that the first fault location value and the second fault location value match, for the corresponding location on the main strand to be ascertained as fault location.

Specifically, using two-sided fault location, it is possible to unambiguously locate only faults that are located on the main strand of the power distribution network. Faults that are located on one of the branches are identified as being located at the respective location of the branch on the main strand based on the behavior of the traveling waves. The same result is achieved when using just single-sided fault location. It is thus possible to conclude as to a fault located on the main strand from a match between the results.

A further advantageous embodiment of the method according to the invention makes provision, in the event that the first fault location value differs from the second fault location value, for the fault location to be identified as being located on one of the branches.

Specifically, in such a case, as explained above, different results are present for the single-sided and the two-sided fault location.

Specifically, in this connection, provision may be made for the faulty branch on which the fault location is located to be indicated by the first fault location value.

Specifically, since two-sided fault location identifies the origin of the traveling wave as being located at the location of the branch, the result of the two-sided fault location gives an indication of the faulty branch.

Specifically, in addition, in this connection, provision may be made for the specific fault location on the faulty branch to be ascertained as the difference between the second fault location value and the first fault location value.

Specifically, while two-sided fault location, as mentioned, indicates the distance to the branch on the main strand, it is possible to ascertain the full distance to the actual fault point using single-sided fault location. The difference then gives the fault location on the branch (seen from the start of the branch).

A further advantageous embodiment of the method according to the invention additionally makes provision for high-frequency current and/or voltage measured values at the respective measurement point to be used as measured values.

To this end, use may be made for example of current or voltage transformers that are already present.

Finally, according to a further advantageous embodiment of the method according to the invention, provision is made for the measured values to be stored in a ring buffer, the content of which is frozen as soon as a traveling wave has been identified in the course of at least one of the measured values.

It is thereby very easily possible to take into consideration the measured value history before the arrival of the traveling wave.

The abovementioned object is also achieved by a device for determining a fault location in an electric power distribution network, wherein the power distribution network has at least one infeed as well as lines in the form of a main strand and a multiplicity of branches branching off from the main strand, wherein the device has an evaluation device that is designed to determine the fault location of a fault that has occurred in the power distribution network on the basis of times at which respective traveling waves arrived at a first and a second measurement point of the power distribution network.

According to the invention, provision is made for the evaluation device to be designed to perform a first fault location using the respective times of both measurement points, generating a first fault location value in the process, for the evaluation device to be designed to perform a second fault location using the times of only the first measurement point, generating a second fault location value in the process, and for the evaluation device to be designed to determine the fault location based on the first fault location value and the second fault location value.

All of the statements made above and below regarding the method according to the invention accordingly hold true with respect to the device according to the invention and vice-versa; in particular, the device according to the invention is designed to perform the method according to the invention in any desired embodiment or a combination of desired embodiments. With respect to the advantages of the device according to the invention, reference is also made to the advantages described regarding the method according to the invention.

Specifically, with regard to the device, provision may be made for the device to be a central data processing device that has a communication unit that is designed to receive information that indicates the times of arrival of the traveling waves at the first and the second measurement point.

The central data processing device may be for example a computer in a control center of the power distribution network.

Specifically, in this connection, provision may however also be made for the device to be a cloud data processing device.

The above-described method may thus be executed on a cloud platform, and the fault location may be offered as a cloud service. The Siemens Mindsphere® may for example be used as cloud platform.

As an alternative, however, provision may also be made for the device to comprise an internal measuring device that is designed to acquire first measured values at the first measurement point of the power distribution network and to ascertain the respective time of arrival of a traveling wave, and for the device to have a communication module that is designed to receive information about the respective time of arrival of a traveling wave at the second measurement point from a remotely arranged measuring device.

Provision may be made here for a device having a measuring device to be provided at only one of the two measurement points, this device receiving, in a manner transmitted by a measuring device from the other measurement point, its measured values or, directly, the information about the times. As an alternative, devices having measuring devices may also be provided at both measurement points, such that the fault location is able to be ascertained at both measurement points. To this end, the devices at both measurement points exchange information about the relevant times with one another.

The invention will be explained in more detail hereinbelow on the basis of an exemplary embodiment. The specific design of the exemplary embodiment should not be understood as restricting for the general design of the method according to the invention and the device according to the invention in any way; on the contrary, individual design features of the exemplary embodiment may be combined in any desired manner freely with one another and with the features described above.

Other features which are considered as characteristic for the invention are set forth in the appended claims.

Although the invention is illustrated and described herein as embodied in method and device for identifying the location of a fault in an electrical power distribution network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
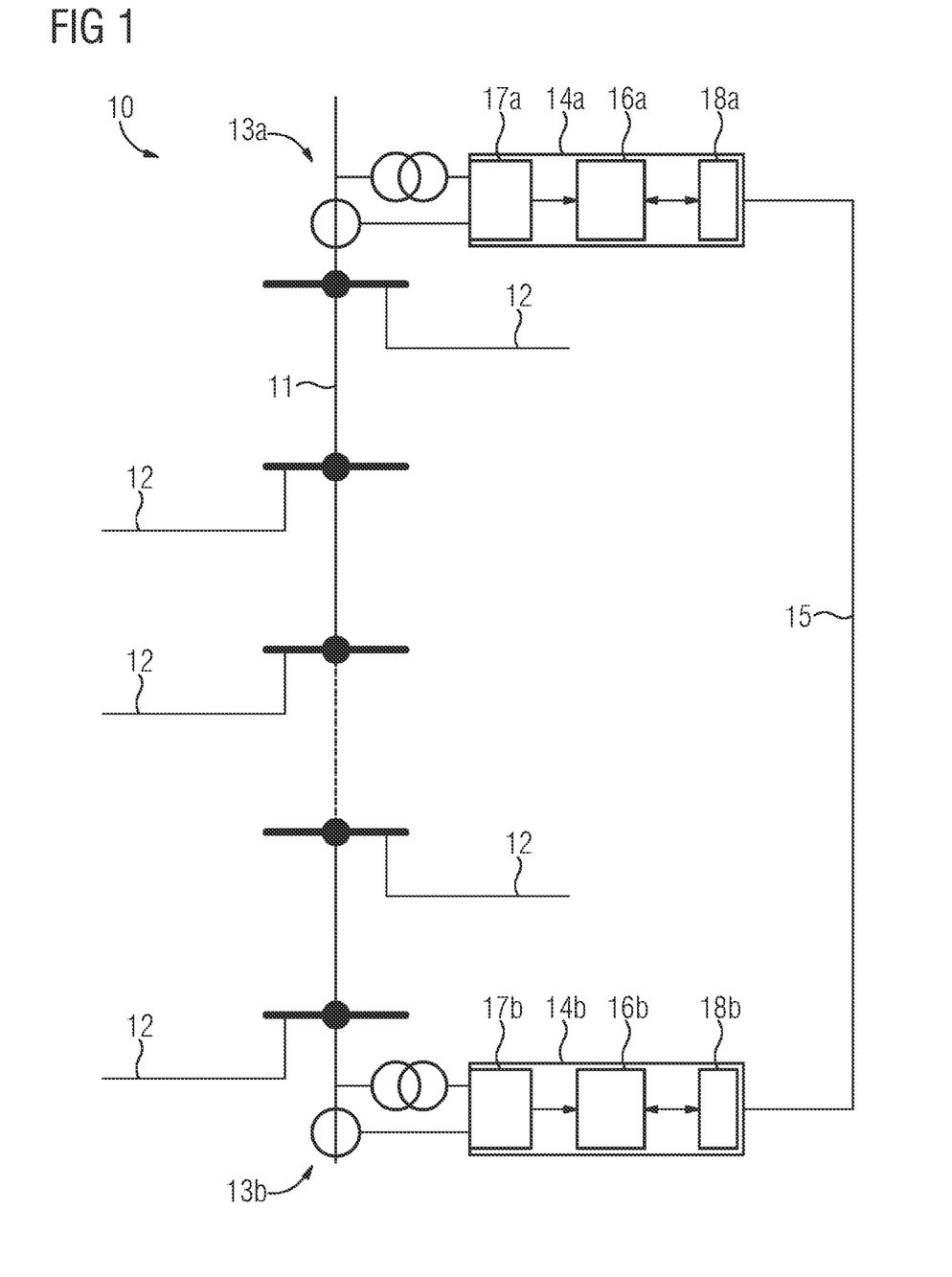
FIG. 1 shows a schematic example of a power distribution network having a linear topology (radial topology)

FIG. 1 shows, by way of example, an electric power distribution network 10 with radial topology, which comprises a main strand 11 and multiple branches 12. In order to locate a fault, for example a short circuit or an earth fault, in the distribution network 10, high-frequency current and/or voltage signals are acquired at measurement points 13a and 13b using devices 14a and 14b and then evaluated as to whether they indicate the arrival of traveling waves. In order to exchange data, the two devices 14a, 14b are connected to one another by way of communication modules 18a, 18b via a communication connection 15, which may be of wireless or wired design. In FIG. 1, the devices 14a, 14b comprise internal measuring devices 17a, 17b for acquiring the high-frequency current and/or voltage signals and an evaluation device 16a, 16b that identifies the arrival of traveling waves on the basis of the recorded measured values and provides them with a highly accurate timestamp. Times at which traveling waves arrive at both measurement points 13a, 13b are thereby determined at said measurement points. The information about the times is exchanged via the communication connection 15. The devices 14a, 14b are able to determine the fault location from the information from both measurement points 13a, 13b.

Figure 2:
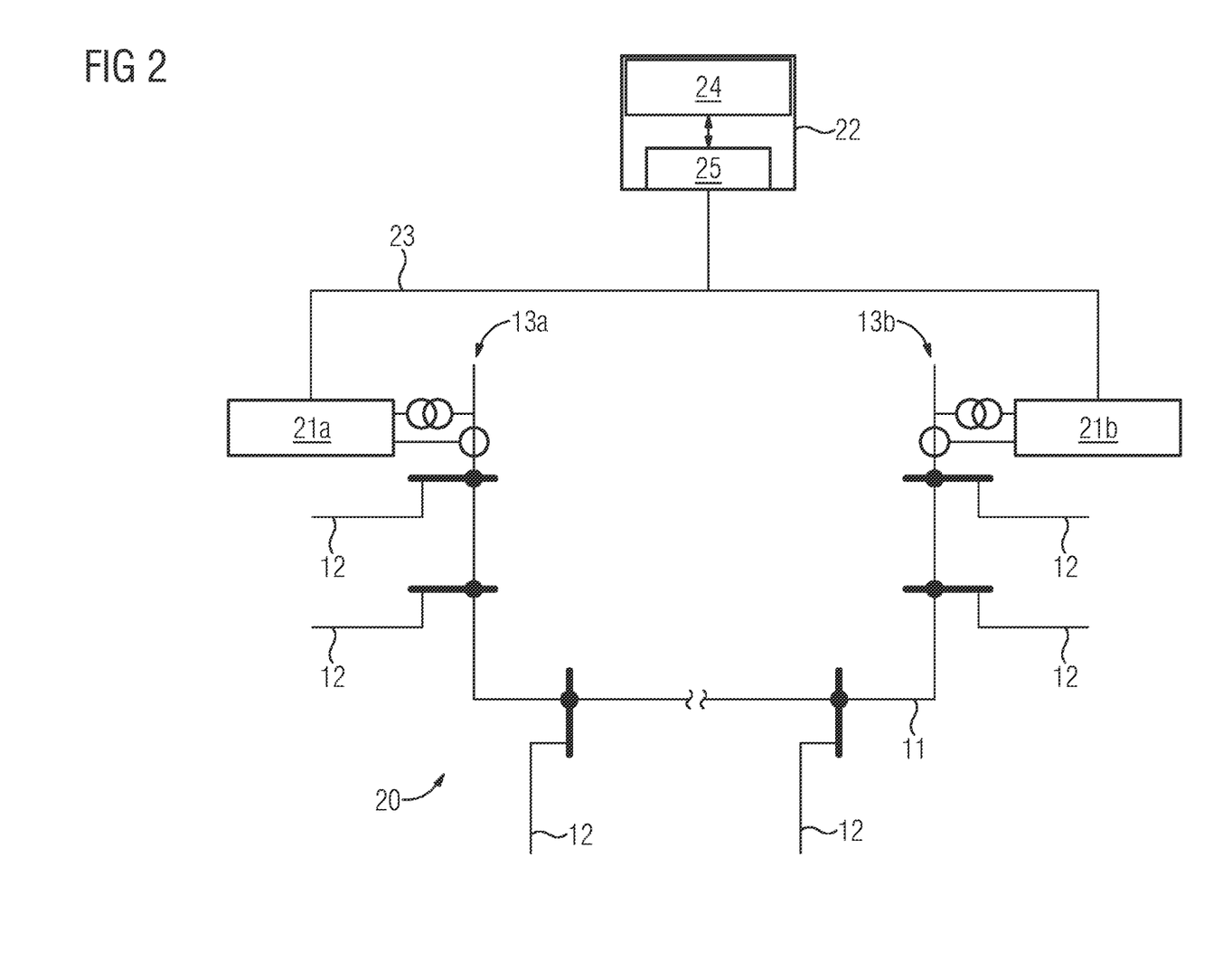
FIG. 2 shows a schematic example of a power distribution network having a ring-shaped topology.

FIG. 2 shows another example of an electric power distribution network 20 that has a ring-shaped topology. The power distribution network 20 in FIG. 2 also has a main strand 11 and multiple branches 12. In order to locate a fault in the distribution network 20, high-frequency current and/or voltage signals are acquired at measurement points 13a and 13b using measuring devices 21a and 21b and then evaluated as to whether they indicate the arrival of traveling waves. The two measuring devices 21a, 21b are connected to a communication unit 25 of a fault location device 22 via a communication connection 23, which may be of wireless or wired design, which fault location device may be in the form for example of a central data processing device or in the form of a cloud computing system. In FIG. 2, the high-frequency current and/or voltage signals are acquired using the measuring devices 21a, 21b and the arrival of traveling waves is identified on the basis of the recorded measured values. In this case, times at which traveling waves arrive at both measurement points 13a, 13b are determined at said measurement points. The information about the times is transmitted to the device 22 via the communication connection 23. An evaluation device 24 of the device 22 is able to determine the fault location from the information from both measurement points 13a, 13b.

The power distribution networks 10, 20 in FIGS. 1 and 2 are exemplary topologies of multi-phase (preferably three-phase) power distribution networks. The neutral points of the networks are preferably suppressed or isolated. The advantage of a suppressed or isolated network design is that the power supply is able to be maintained even during an earth fault.

The individual branches 12 of distribution networks are typically not monitored. Complex protection devices, such as what are known as transient earth fault relays, earth fault relays using the wattmetric measurement method or earth current differential protection relays are usually provided only in transmission networks and are used sparingly or even not at all in distribution networks for reasons of cost. It is thus also barely possible, or even not possible at all, to accurately locate the fault using conventional methods. Earth faults additionally often die out on their own. In such a case, it is often possible only to make a statement about the main strand along which the earth fault is located. Such earth faults were previously only able to be located in the event of continuous earth faults (usually earth faults in the cable) and/or when using additional measurement technology.

In this case, a method is proposed for allowing a fault to be located with high accuracy using few measuring devices, specifically only two measuring devices per main strand.

The process of the fault location is intended to be explained in more detail below with reference to the flowcharts in FIGS. 3 and 4 and the network illustrations in the form of what are known as "propagation diagrams" in FIGS. 5 to 8.

Figure 3:
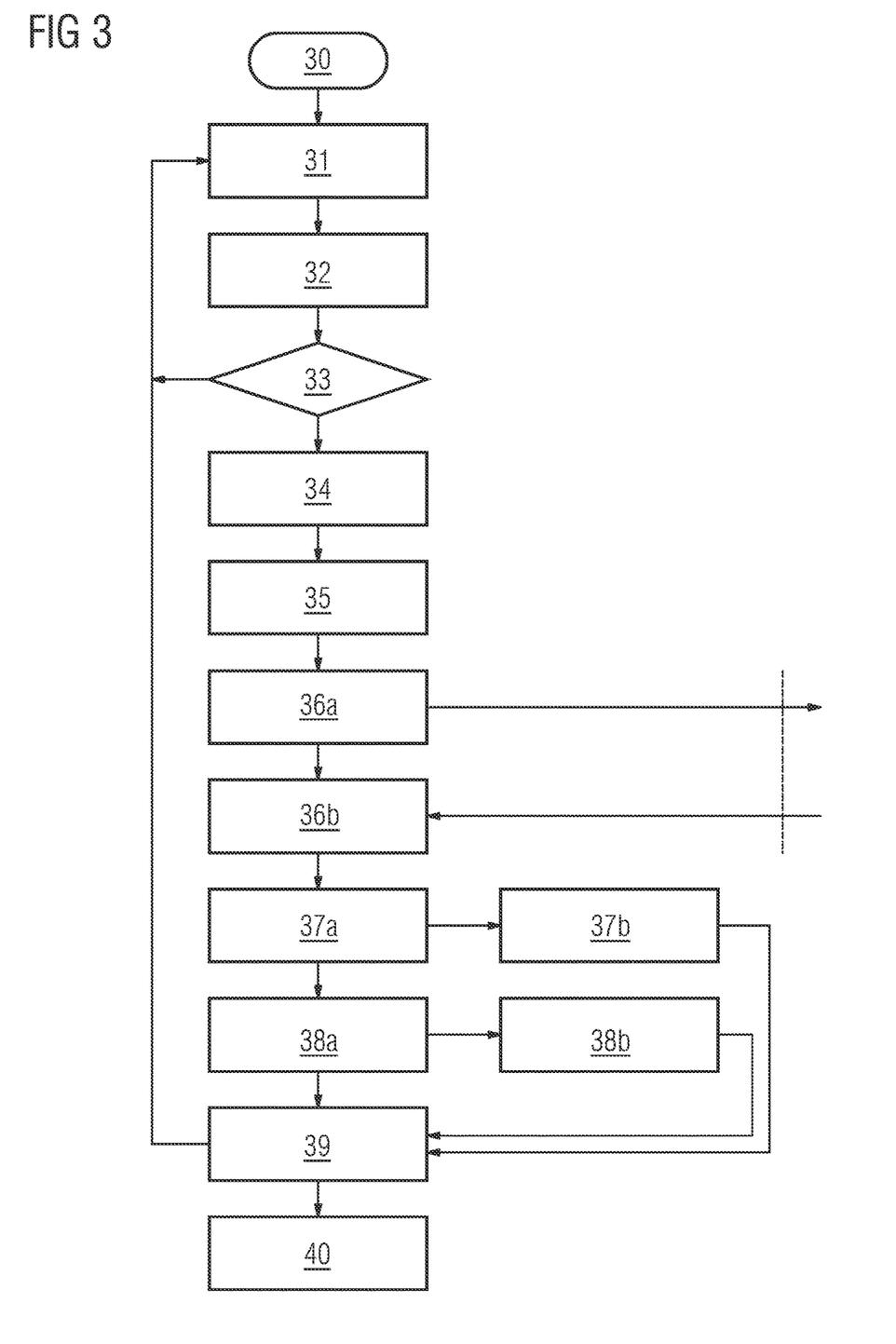
FIG. 3 shows a method flowchart for explaining an exemplary embodiment of a method for fault location in a power distribution network.
Figure 4:
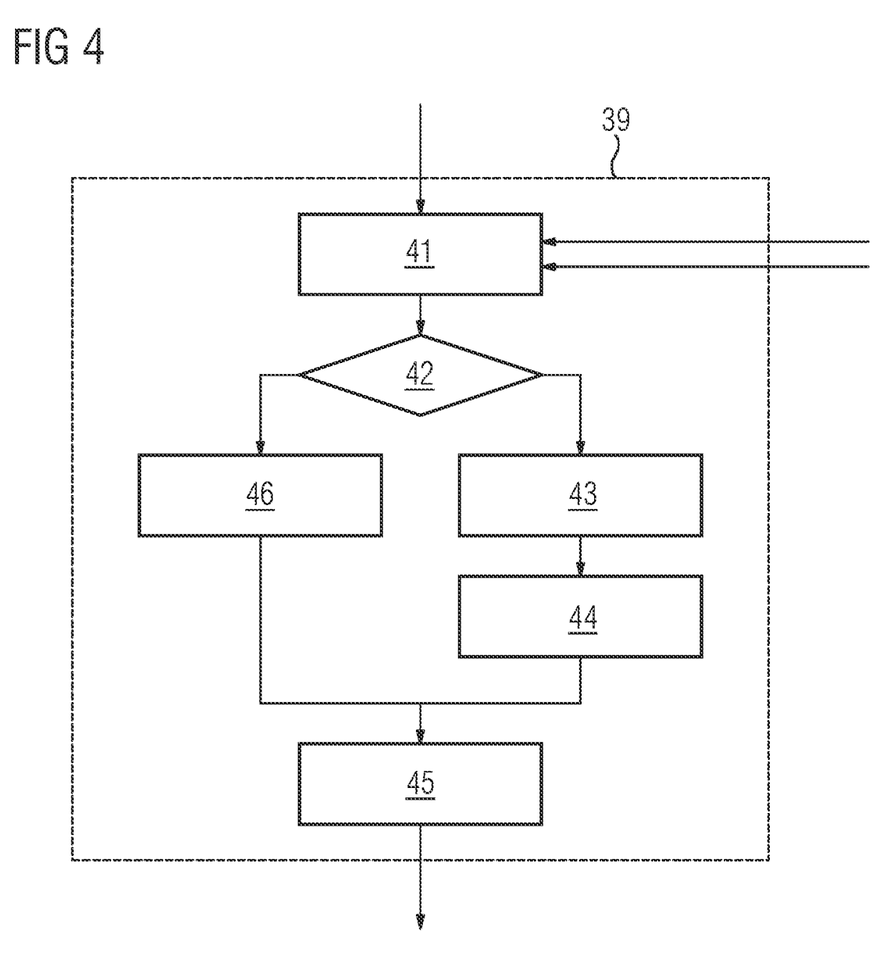
FIG. 4 shows a method flowchart for explaining a detail of the exemplary embodiment according to FIG. 3.

To this end, FIG. 3 shows a method flowchart illustrating an exemplary embodiment of a method for locating a fault in an electric power distribution network. The illustrated method steps are performed by one or both devices 14a, 14b (FIG. 1) or the measuring devices 21a, 21b and the device 22 (FIG. 2).

The method begins at step 30, in which current and/or voltage signals are acquired at the measurement points 13a, 13b and converted into digital sample values. The sampling rate for forming sample values is in this case comparatively high (for instance in the range of a few megahertz), in order to be able to sample the high-frequency signals so as to identify traveling waves. After bandpass filtering of the sample values (step 31), the sample values of the signals are fed into a ring buffer (step 32). In this case, the in each case oldest sample values of the signal are overwritten when the ring buffer has reached its maximum fill level.

Proceeding from the in each case newest sample value in the ring buffer, a trigger module checks (step 33) whether a traveling wave has arrived. This may preferably be performed by identifying a wavefront that arrives at the corresponding measurement point. By way of example, for this purpose, threshold value comparisons or pattern recognitions may be performed in order to identify a jump in the acquired signal. The trigger module evaluates each phase of the power distribution network individually.

If the arrival of a traveling wave is identified as trigger event in at least one phase, the complete ring buffer is "frozen" and the sample values of the phase variables are broken down into modal components ($\alpha$ component, $\beta$ component, zero component) (step 34). What is known as the "Clarke transformation" may be used for this purpose, for example.

The times at which the in each case first wavefronts of the individual modes arrived at the measurement points are ascertained using internal timers and stored (step 35).

In a following step 36a, the respective information about the time of arrival of the traveling wave is transmitted to a fault location device. In the case of an integrated measuring and fault location device, this may be the device at the other measurement point (example of FIG. 1) or, in the case of central fault location ascertainment, this may be the central device (example of FIG. 2). If the fault location is performed directly at the measurement point in a decentralized manner using integrated devices, in a following step 36b, the information about the respective time of arrival of the traveling wave at the other measurement point is received. In the example of FIG. 3, it should be assumed that the fault location is performed in a decentralized manner, such that the information about the times at which the traveling waves arrived at the respective measurement points is exchanged between the two devices at the measurement points in steps 36a and 36b. After steps 36a and 36b, the information about all of the times is present in both devices.

This information is used to perform two-sided fault location in a following step 37a. In this case, a first fault location value is determined and temporarily stored (step 37b). In two-sided fault location, the position of the fault on the main strand is determined using the modal zero components at both measurement points, or the position on the main strand at which the faulty branch branches off is ascertained.

Using the relationships between time and distance that a traveling wave requires in order to arrive at a measurement point from the fault location, it is possible to create the following formulae for the main strand:

$$x = (t_{A(0)} - t_0) \cdot v_0$$

$$L - x = (t_{B(0)} - t_0) \cdot v_0$$

In this case, x denotes the possible fault location (as distance seen from measurement point A) and L denotes the length of the main strand (distance between the two measurement points A and B), $t_0$ denotes the unknown time of occurrence of the fault and $t_{A(0)}$ and $t_{B(0)}$ denote the determined times of arrival of the modal zero components of the traveling waves (in each case first wavefronts) at both measurement points A and B. The measuring devices are in this case temporally synchronized so as to be able to determine comparable times.

Combining the abovementioned two equations gives the first fault location value:

$$x = \frac{L + (t_{A(0)} - t_{B(0)}) \cdot v_0}{2}$$

Figure 5:
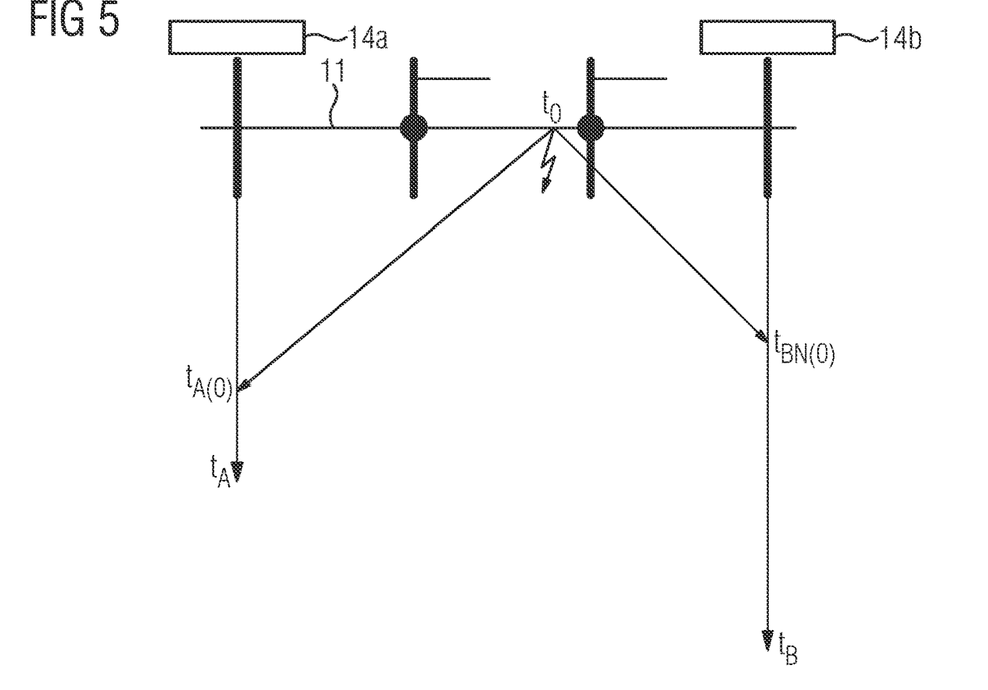
FIG. 5 shows an exemplary network diagram of a power distribution network with a fault on the main strand.

This relationship is illustrated in the Bergeron diagram in FIG. 5, which indicates a fault on the main strand 11, from which traveling waves propagate to the two measurement points and are acquired there using the devices 14*a* and 14*b*.

Figure 6:
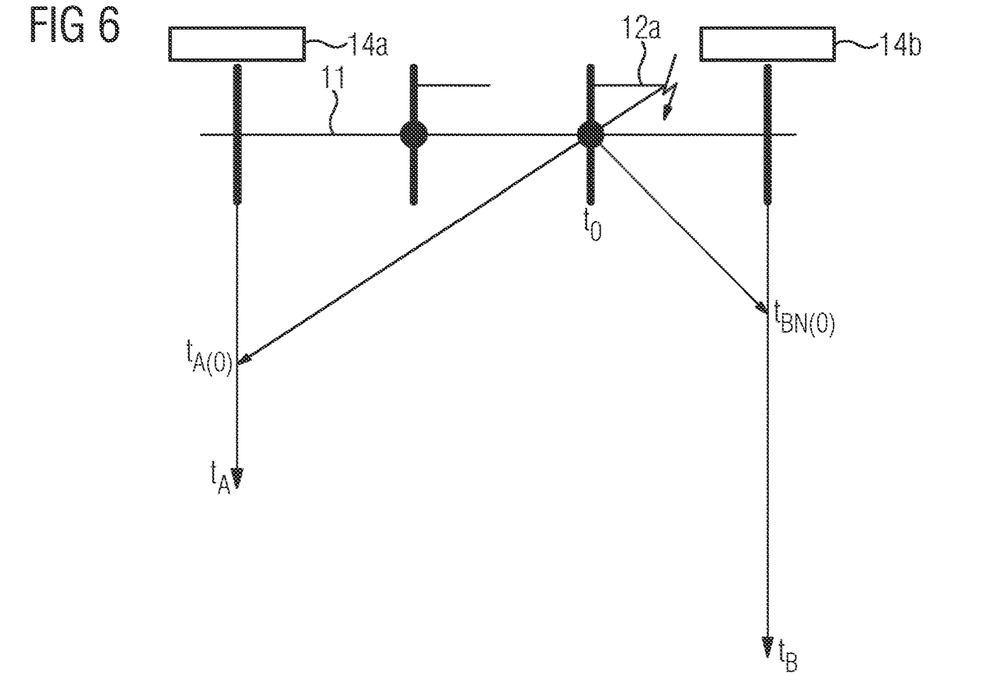
FIG. 6 shows the network diagram from FIG. 5 with a fault on a first branch.
Figure 7:
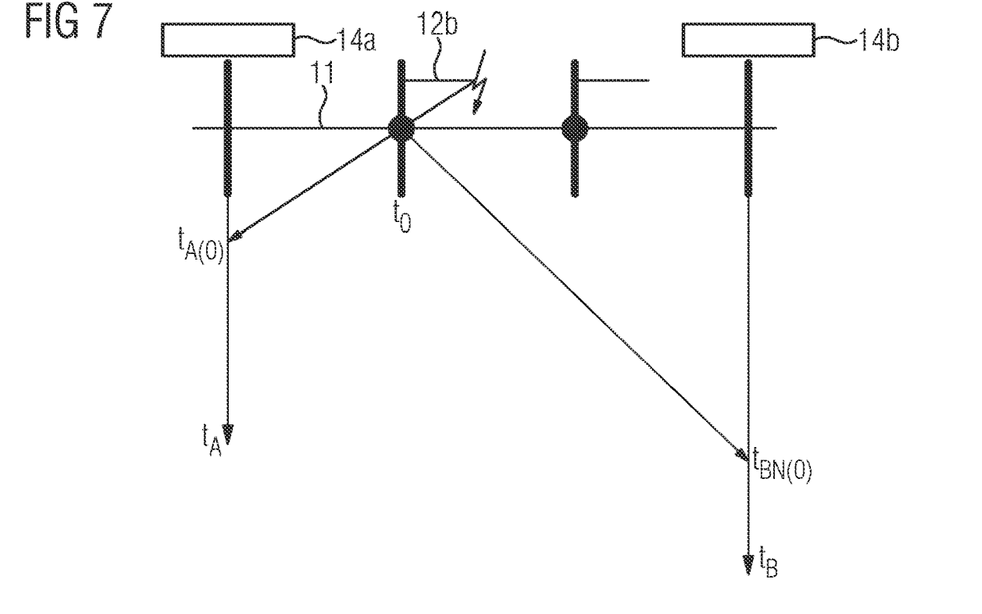
FIG. 7 shows the network diagram from FIG. 5 with a fault on a second branch.

FIGS. 6 and 7 show further propagation diagrams in which the propagation of the traveling waves in each case emanates from the location at which a branch is arranged. The two-sided fault location in accordance with the above equation for FIG. 6 thus results in a first fault location value that matches the location of the branch 12*a*. This means that the fault is located either directly at this location on the main strand 11 or somewhere on this branch 12*a*. The two-sided fault location for FIG. 7 accordingly results in a first fault location value that matches the location of the branch 12*b*. This means that the fault is located either directly at this location on the main strand 11 or somewhere on this branch 12*b*.

If a mixed stretch consisting of cables and overhead lines is present between the devices along the main strand 11, this also has to be taken into consideration in the fault location. To this end, it is necessary to use additional information about the segments in question, this being able to be generated for example by fault indicators.

In order to be able to accurately determine the fault location, according to a following step 38*a* (see FIG. 3), single-sided fault location is performed and, in step 38*b*, a second fault location value is generated. In single-sided fault location, use is made of the fact that the modal zero component of the traveling waves differs from the α and β components in terms of its propagation speed. It is thus possible, on the basis of the different times of arrival of the traveling waves of the modal components, to ascertain the distance to the fault location from a measurement point.

The propagation speeds of modal components (modes) are able to be ascertained using various techniques, with a distinction being able to be drawn between computer-based and measurement-based techniques.

In the case of computing, proven transformation methods may be used, for example by way of eigenvalue analysis in the case of symmetrical impedance and admittance matrices, by way of the Clarke transformation or by way of the Dommel transformation.

Determination through measurement requires a controlled traveling wave effect when the line length is known. By way of example, in suppressed or isolated networks, it is possible to perform earth fault tests or switching operations that result in transient effects that are sufficient to ascertain the speeds of all of the modes.

For single-sided fault location, the propagation times of the traveling wave from the location of the faulty branch to the measurement point have to be taken into consideration:

$$t_{branch(i)} = t_{A(\alpha,\beta)} - \frac{x}{v_{(\alpha,\beta)}} - \frac{\Delta x}{v_{branch(\alpha,\beta)}}$$

$$t_{branch(i)} = t_{A(0)} - \frac{x}{v_{(0)}} - \frac{\Delta x}{v_{branch(0)}}$$

Figure 8:
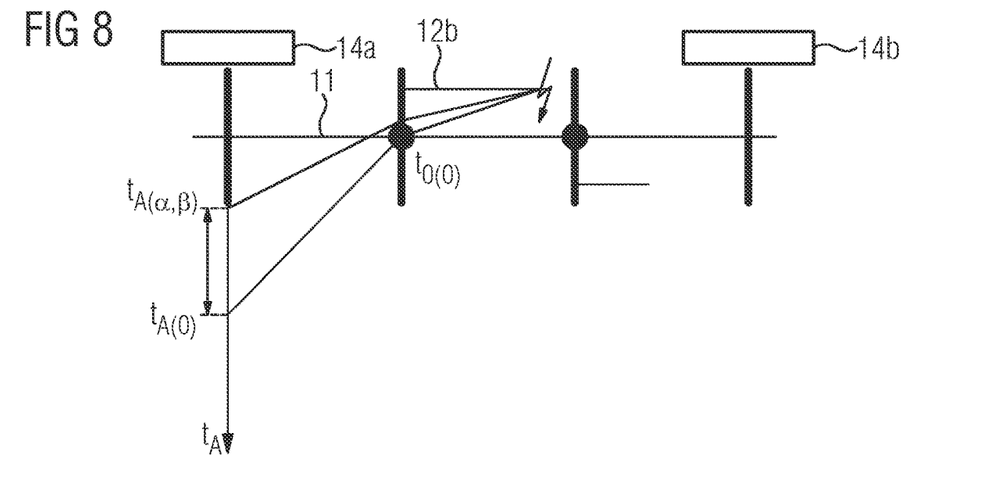
FIG. 8 shows the network diagram from FIG. 7 for explaining the fault location.

The value x in this case represents the second fault location value. Since it is possible to take into consideration the modal zero component, on the one hand, and the modal α and β components, on the other hand, it is possible to estimate the time of occurrence of the fault $t_{branch(i)}$ for the respective modal components. This is shown in FIG. 8. The estimate is plausible only if the actual fault location Δx on the branch (Δx=distance from the location of the branch on the main strand to the fault location as difference between the first and the second fault location value) is known. Since the fault location Δx is sought, the above equations may be equated:

$$t_{A(0)} - \frac{x}{v_{(0)}} - \frac{\Delta x}{v_{branch(0)}} = t_{A(\alpha,\beta)} - \frac{x}{v_{(\alpha,\beta)}} - \frac{\Delta x}{v_{branch(\alpha,\beta)}}$$

$$\frac{\Delta x}{v_{branch(\alpha,\beta)}} - \frac{\Delta x}{v_{branch(0)}} = t_{A(\alpha,\beta)} - t_{A(0)} - \frac{x}{v_{(\alpha,\beta)}} + \frac{x}{v_{(0)}}$$

$$\Delta x \left( \frac{1}{v_{branch(\alpha,\beta)}} - \frac{1}{v_{branch(0)}} \right) = t_{A(\alpha,\beta)} - t_{A(0)} - x \left( \frac{1}{v_{(\alpha,\beta)}} - \frac{1}{v_{(0)}} \right)$$

If $\Delta t_{A(\alpha,\beta,0)}$ is defined as the time difference between the arriving traveling waves of the zero and α, β component, this gives, after a quick rearrangement:

$$\Delta x \left( \frac{v_{branch(0)} - v_{branch(\alpha,\beta)}}{v_{branch(\alpha,\beta)} v_{branch(0)}} \right) = \Delta t_{A(\alpha,\beta,0)} - x \left( \frac{v_{(0)} - v_{(\alpha,\beta)}}{v_{(\alpha,\beta)} v_{(0)}} \right)$$

The first fault location value already determined by way of the two-sided fault location method is inserted in place of x, this corresponding to the distance $d_{branch(i)}$ from the measurement point in the event of a fault on the branch:

$$\Delta x \left( \frac{v_{branch(0)} - v_{branch(\alpha,\beta)}}{v_{branch(\alpha,\beta)} v_{branch(0)}} \right) = \Delta t_{A(\alpha,\beta,0)} - d_{branch(i)} \left( \frac{v_{(0)} - v_{(\alpha,\beta)}}{v_{(\alpha,\beta)} v_{(0)}} \right)$$

$$\Delta x \cdot k_{v\_branch(i)} = \Delta t_{A(\alpha,\beta,0)} - d_{branch(i)} \cdot k_{v\_main\ strand}$$

The following meanings are given here:

$$k_{v\_branch\,i(i)} = \left(\frac{v_{branch(0)} - v_{branch(\alpha,\beta)}}{v_{branch(\alpha,\beta)}v_{branch(0)}}\right)$$

$$k_{v\_main\ strand} = \left(\frac{v_{(0)} - v_{(\alpha,\beta)}}{v_{(\alpha,\beta)}v_{(0)}}\right)$$

The distance $\Delta x$ on the faulty branch i thus results as:

$$\Delta x = \frac{\Delta t_{A(\alpha,\beta,0)} - d_{branch(i)} \cdot k_{v\_main\ strand}}{k_{v\_branch(i)}}$$

If the main strand consists of different sections that have differing parameters, the fault location is calculated using a slightly different formula:

$$\Delta x = \frac{\Delta t_{A(\alpha,\beta,0)} - \sum_m^M d_{section(m)} \cdot k_{v\_section(m)}}{k_{v\_branch(i)}}$$

In order to calculate the fault location, the created equations are combined with one another by determining the unknown to from one equation and inserting it into the other equation.

In step 39 (cf. FIG. 3), the first and the second fault location value are used to check whether the fault location is located on the main strand or on one of the branches. This is explained in more detail with reference to FIG. 4, which illustrates a detailed view of step 39, as it were.

The first and the second fault location value are first of all supplied to a block 41. In a comparison block 42, it is checked whether both fault location values are identical in terms of measurement accuracy. If this is the case (block 46), then the fault is located on the main strand and the identical fault location values indicate the actual fault location. If the fault location values are not identical, on the other hand, then, in block 43, the first fault location value indicates the location of the branch on which the fault is located. The difference between the second fault location value and the first fault location value, in block 44, indicates the distance from the location of the branch where the actual fault location is located. This is denoted in the above equations as $\Delta x$. In block 45, the fault location is provided at output.

The method is ended according to FIG. 3 in step 40, in which the fault location is output. The fault location may for example be transmitted to a control center in the form of a telegram and/or be displayed on a display.

Both signals of currents and of voltages may be used to acquire traveling wavefronts. The earth current in a suppressed or isolated system is acquired by way of sensitive transformers. It is therefore recommended to take the associated zero mode component as a basis for the fault location. If only the current transformers are used, it has to be ensured that the infeed or the effect of further parts of the network are able to be acquired via the measurement points. In the case of the exemplary network in FIGS. 1 and 2, the following features have to be identified for the fault location:

Radial network
two-sided infeed; or
single-sided infeed and upstream branches or arc suppression coils on the other side.

Ring network
Ring is not open, that is to say the infeed comes from both sides; or
Ring is open, that is to say single-sided infeed from one ring end and the upstream branches or arc suppression coils at the other ring end.

If conditions a) and b) are not met, it is possible to perform the fault location with voltage variables. In line with experience, primary voltage transformers are located on the medium voltage level, exhibit broadband transformation behavior and are suitable for acquiring and locating faults using traveling waves.

Figure 9:
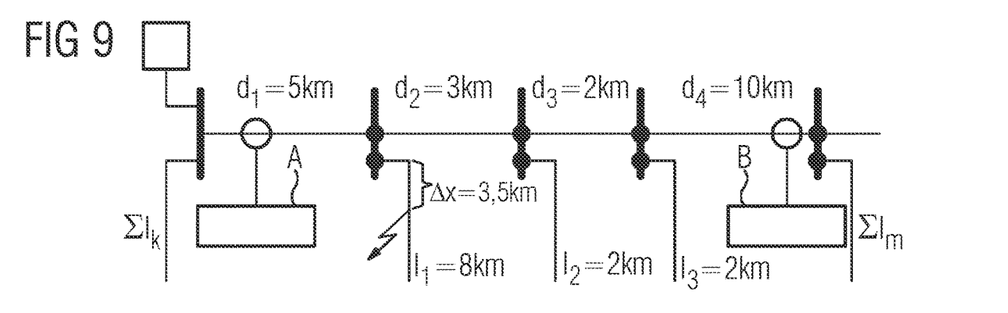
FIG. 9 shows a further network diagram for explaining an exemplary embodiment for fault location.

Finally, a specific example based on the radial network according to FIG. 9 is intended to be explained in order to better illustrate the fault location process.

The exemplary distribution network is supplied from one side. Measurement point A on the main strand downstream of the first tap (seen from the infeed) is selected as measurement location. If further taps are located on the busbar at measurement location A, these may be combined to form an overall length $\Sigma_{k=1}^{K} l_k$. This overall length is required as criterion for selecting the measured variables used for fault location. A minimum length is necessary for current signals. Voltage variables, on the other hand, are always able to be used without restrictions provided that appropriate transformers are present.

Measurement point B is selected on the main strand upstream of the last tap. The supply network is not fed from this side but has further branches. The condition described above under a) for the fault location is thus met. The following quantities are used to describe the segments of the main strand between measurement points A and B and the branches:

d={5 km, 3 km, 2 km, 10 km},
l={8 km, 2 km, 3 km}

The fault assumed in the example is present as an earth fault on the second branch at a position of $\Delta x$=3.5 km (distance of the location of the branch from the main strand). The modal wave propagation speeds for the distribution network are assumed to be $v_0$=196910 km/s,
$v_{\alpha,\beta}$=294290 km/s.

This is supposed to be a homogeneous network structure, and so the parameters of all of the segments are the same.

Figure 10:
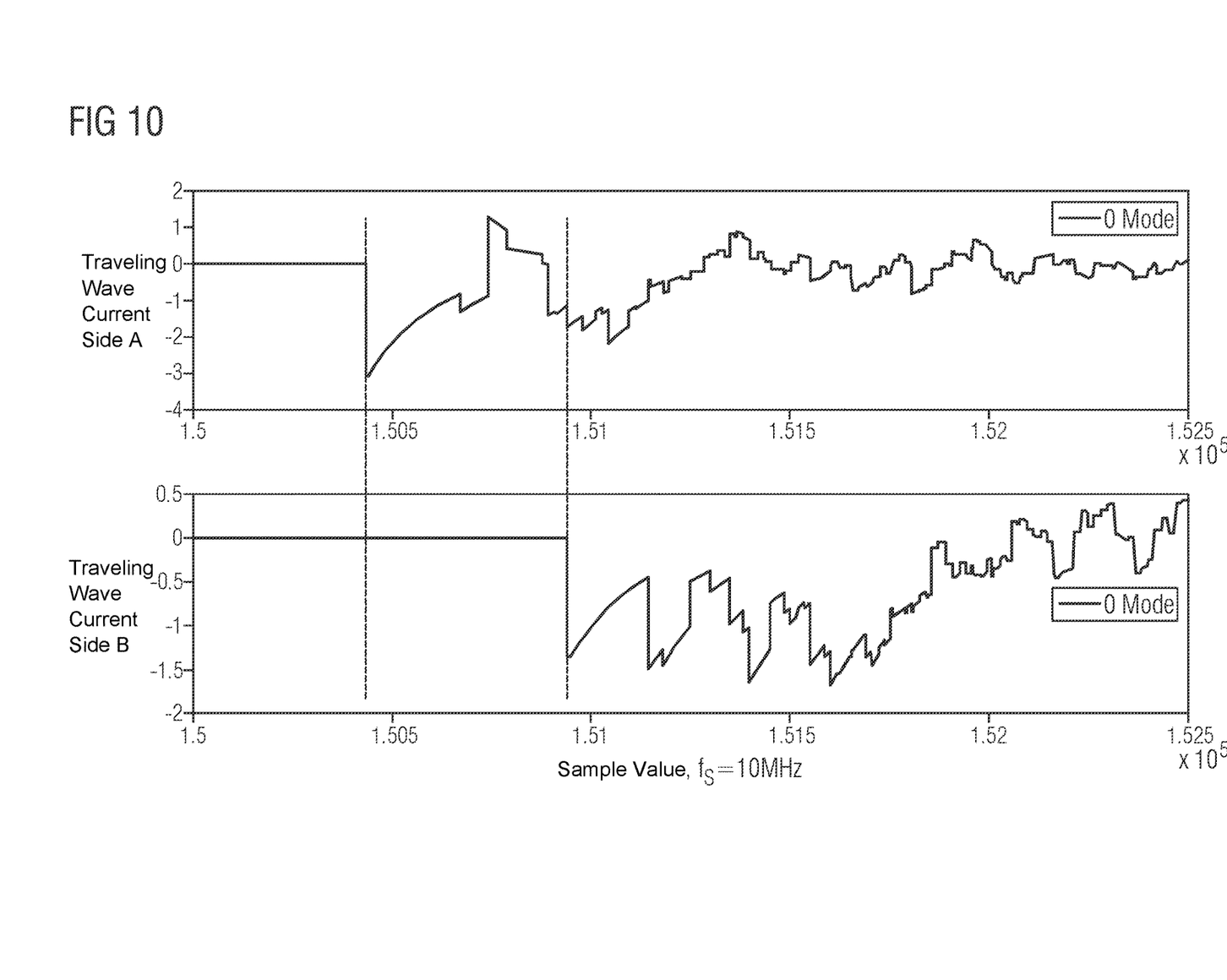
FIG. 10 shows graphs for illustrating exemplary traveling waves at two measurement points.

The fault location is sought as the distance from measurement point A. The expected result is 8.5 km (cf. FIG. 9). To determine the earth fault, current signals are taken into consideration in order to detect the arrival of traveling waves caused by the fault at measurement points A and B. The profiles of the modal zero components at both measurement points are illustrated by way of example in the graphs of FIG. 10.

In the course of two-sided fault location, the times of arrival of the traveling waves at both measurement points are captured. The times are inserted into the abovementioned equation for two-sided fault location:

$$x = \frac{L + (t_{A(0)} - t_{B(0)}) \cdot v_0}{2}$$

$$x = \frac{20\,\text{km} + (15043.5\,\mu s - 15094.3\,\mu s) \cdot 196910\,\text{km/s}}{2} = 5\,\text{km}$$

Figure 11:
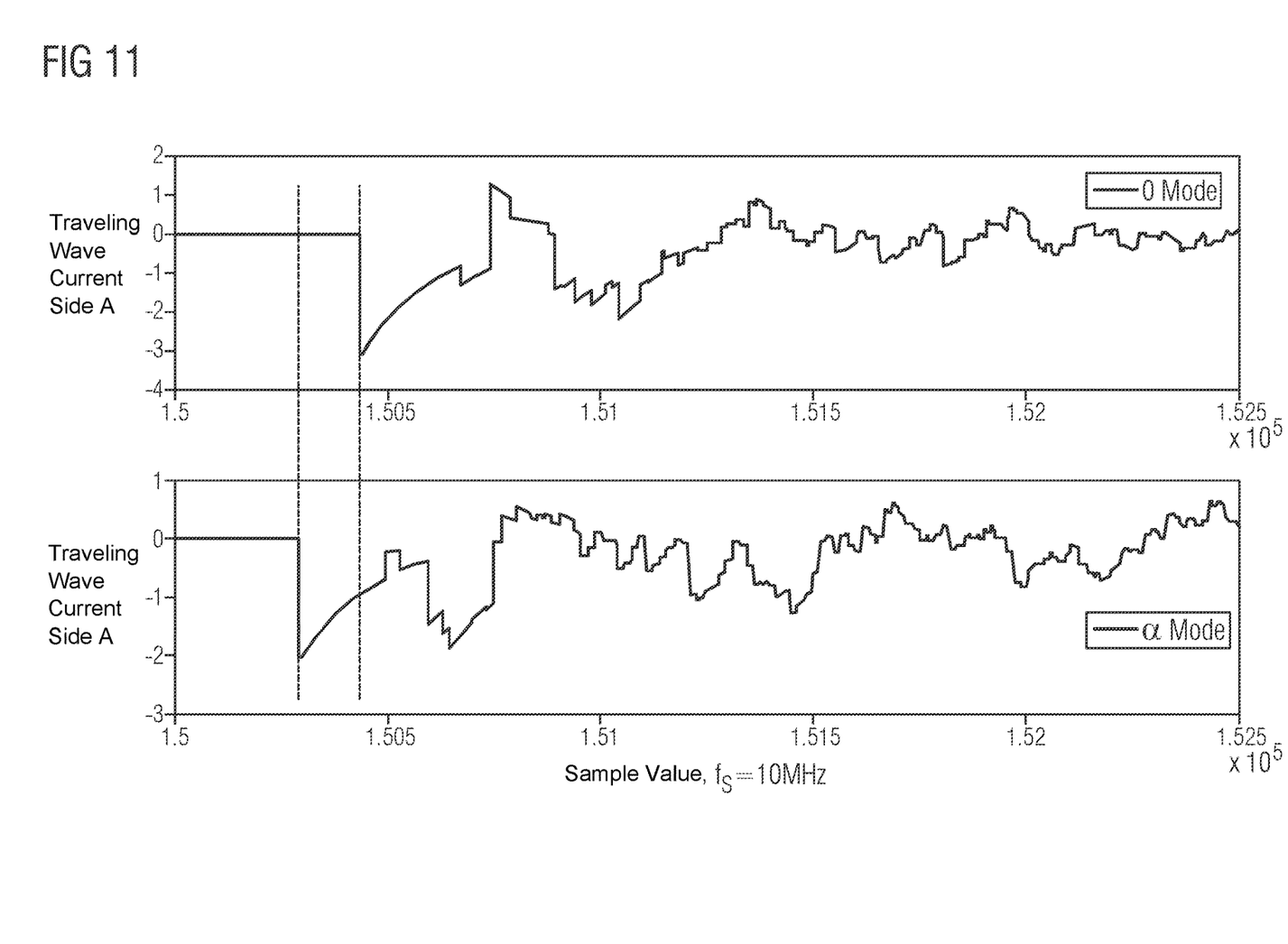
FIG. 11 shows graphs for illustrating exemplary traveling waves at one measurement point.

Since the calculated first fault location value indicates the distance on the main strand to the first branch x=5 km ∈{5 km,3 km,2 km,10 km} the fault may be located either directly at the location of the branch on the main strand or on the branch itself. For more accurate location, single-sided fault location is performed using the modal zero component and the modal α or β component. In single-sided fault location, the distance from measurement point A is ascertained as a second fault location value, as it were. If the first fault location value is known, if the fault location values are not identical, it is then possible to determine the distance on the faulty branch. The abovementioned equation is used for this purpose, and the times to be used are given by the graphs in FIG. 11:

$$\Delta x = \frac{\Delta t_{A(\alpha,\beta,0)} - d_{branch(i)} \cdot k_{v\_main\ strand}}{k_{v\_branch(i)}}$$

$$\Delta x = \frac{(15029.2\ \mu s - 15043.5\ \mu s) - 5\ km \cdot \left(-1.6805 \cdot \frac{10^{-6} s}{km}\right)}{\left(-1.6805 \cdot \frac{10^{-6} s}{km}\right)} = 3.509\ km$$

Overall, this thus gives an actual fault location of 8.509 km as distance from measurement point A.

The described process delivers a solution that allows economical and efficient fault location, in particular in doubly or singly fed non-effectively earthed medium voltage distribution networks, in which data from only two measurement points are required. Depending on the topology of the networks, it is possible to work only with current signals, meaning that it is often not necessary to install any additional voltage transformers. The process thereby allows cost-efficient fault location ascertainment in non-effectively earthed networks with a minimum level of required device technology and may thus considerably reduce the expenditure required for fault location in comparison with conventional solutions. This allows fault location in networks in which an economical solution was previously not possible. When voltage transformers are present, the measurement points may also be selected directly at the start and end of the main strand.

In the described process, a respective measurement point is preferably arranged downstream of the first tap and upstream of the last tap (seen from the main infeed). The respective times of arrival of traveling waves at the measurement points are acquired and evaluated in a fault location device. This may be a central device. It is however also possible to use one or two decentralized devices preferably integrating the measuring devices for acquiring the current or voltage signals. Different modal components of the traveling wave are taken into consideration, and the fault location is ascertained by combining the results of two-sided and single-sided fault location. If the results of the two-sided and single-sided fault location match, the calculated fault location on the main strand is output as actual fault location. If the two fault location results do not match, the difference between the two fault distances is indicated as fault distance. The faulty branch is ascertained through the result of the two-sided fault location.

Although the invention has been illustrated and described in more detail above by preferred exemplary embodiments, the invention is not restricted by the disclosed examples and other variations may be derived therefrom by a person skilled in the art without departing from the scope of protection of the following patent claims.

The invention claimed is:

1. A method for determining a fault location in an electric power distribution network, wherein the power distribution network has at least one infeed and lines forming a main strand and a plurality of branches branching off from the main strand, the method comprising:
    acquiring first measured values at a first measurement point of the power distribution network;
    acquiring second measured values at a second measurement point of the power distribution network;
    determining the fault location of the fault that has occurred in the power distribution network based on the first and the second measured values;
    identifying an arrival of respective traveling waves based on the first and the second measured values, the traveling waves indicating a fault that has occurred in the power distribution network, and storing the times of the respective arrival of the traveling waves;
    performing a first fault-locating process using the respective times of the first and second measurement points for generating a first fault location value;
    performing a second fault-locating process using the times of only the first measurement point for generating a second fault location value; and
    determining the fault location based on the first fault location value and the second fault location value.

2. The method according to claim 1, further comprising:
    breaking down the acquired measured values into modal components, wherein at least two of the modal components have different propagation speeds along the lines of the power distribution network; and
    applying at least partially different modal components for the first and second fault-locating processes.

3. The method according to claim 2, further comprising using the respective times at which a first wave edge of a modal zero component of the traveling wave arrived at the first and second measurement point for the first fault-locating process for forming the first fault location value.

4. The method according to claim 2, further comprising using the respective times at which a first wave edge of a modal zero component and of a modal α or β component of the traveling wave arrived at the first measurement point for the second fault-locating process for forming the second fault location value.

5. The method according to claim 1, further comprising ascertaining a corresponding location on the main strand as the fault location if the first fault location value and the second fault location value match.

6. The method according to claim 1, further comprising Identifying the fault location as being located on one of the branches if the first fault location value differs from the second fault location value.

7. The method according to claim 6, further comprising indicating a faulty branch on which the fault location is located by the first fault location value.

8. The method according to claim 7, further comprising ascertaining the specific fault location on the faulty branch as the difference between the second fault location value and the first fault location value.

9. The method according to claim 1, further comprising measuring high-frequency current and/or voltage values at the respective measurement point and using the high-frequency current and/or voltage values as measured values.

10. The method according to claim 1, further comprising storing the measured values in a ring buffer, the content of which is frozen as soon as a traveling wave has been identified in the course of acquiring at least one of the measured values.

11. A device for determining a fault location in an electric power distribution network, wherein the power distribution network has at least one infeed and lines forming a main strand and a plurality of branches branching off from the main strand, the device comprising:

an evaluation device configured to determine the fault location of a fault that has occurred in the power distribution network based on times at which respective traveling waves arrive at a first measurement point and a second measurement point of the power distribution network;

said evaluation device being configured to perform a first fault-locating process using the respective times of the first and second measurement points and generating a first fault location value;

said evaluation device being configured to perform a second fault-locating process using the times of only the first measurement point and generating a second fault location value; and the evaluation device is designed to determine the fault location based on the first fault location value and the second fault location value.

12. The device according to claim 11, wherein the device is a central data processing device that has a communication unit configured to receive information that indicates the times of arrival of said traveling waves at said first and said second measurement point.

13. The device according to claim 12, wherein said device is a cloud data processing device.

14. The device according to claim 11, further comprising:

an internal measuring device configured to acquire first measured values at said first measurement point of the power distribution network and to ascertain a respective time of arrival of a traveling wave; and a communication module configured to receive information about a respective time of arrival of a traveling wave at said second measurement point from a remotely arranged measuring device.

* * * * *